United States Patent [19]

Takahashi et al.

[11] 4,259,666

[45] Mar. 31, 1981

[54] APPARATUS FOR DETECTING DEGRADATION OF CHARACTERISTICS OF ARRESTERS

[75] Inventors: Shigeru Takahashi, Yokohama; Iwao Ohshima, Kawasaki; Masaki Honda; Mizuho Yamashita, both of Yokohama, all of Japan

[73] Assignee: Tokyo Shibaura Denki Kabushiki Kaisha, Kanagawa, Japan

[21] Appl. No.: 95,606

[22] Filed: Nov. 19, 1979

[30] Foreign Application Priority Data

Nov. 21, 1978 [JP] Japan .................................. 53/142832

[51] Int. Cl.$^3$ ............................................. G08B 21/00
[52] U.S. Cl. .................................. 340/647; 340/650; 340/653; 324/72
[58] Field of Search ............... 340/635, 647, 650, 653, 340/657; 324/72

[56] References Cited

U.S. PATENT DOCUMENTS

| | | | |
|---|---|---|---|
| 3,090,112 | 5/1963 | Smith | 324/72 |
| 3,156,866 | 11/1964 | Anderson et al. | 340/647 |

FOREIGN PATENT DOCUMENTS 1118861  6/1956  France ................................... 340/647

Primary Examiner—Alvin H. Waring
Attorney, Agent, or Firm—Stevens, Davis, Miller & Mosher

[57] ABSTRACT

In an arrester comprising a characteristic element made up of a stack of a plurality of metal oxide resistors, parallelly connected capacitor and a linear resistor are connected between the characteristic element and ground, and voltage drop across the linear resistor is used to light a neon lamp or to operate an alarm device for detecting deterioration of the characteristic element. To protect the capacitor and the linear resistor at the time when the arrester operates, a nonlinear resistor may be connected in parallel with the capacitor and the linear resistor.

4 Claims, 7 Drawing Figures

FIG. 1
PRIOR ART
FIG. 2
PRIOR ART
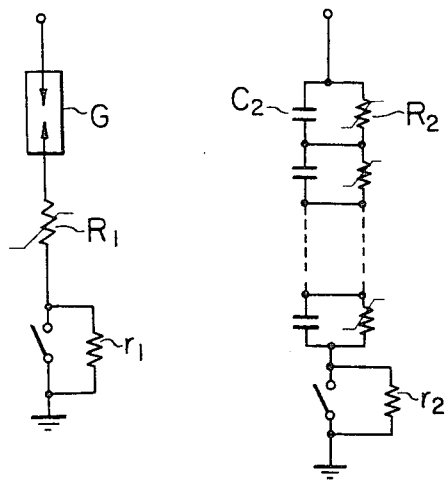
FIG. 3
PRIOR ART
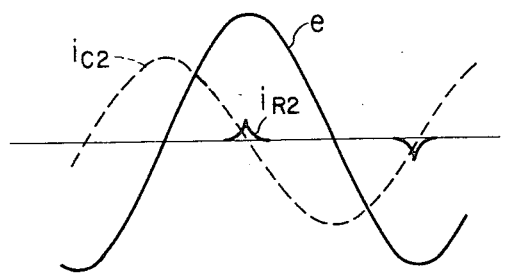

APPARATUS FOR DETECTING DEGRADATION OF CHARACTERISTICS OF ARRESTERS

BACKGROUND OF THE INVENTION

This invention relates to apparatus for detecting degradation of the characteristics of an arrester, more particularly of the type utilizing a stack of zinc oxide type nonlinear resistors as a characteristic element.

The characteristic elements or the nonlinear resistors utilized in the prior art arrester have generally been of the SiC type. However, due to insufficient nonlinearity, the SiC type characteristic elements could not be used for arresters not provided with series gaps.

In recent years metal oxide type resistors, more particularly zinc oxide type resistors, having a large nonlinear coefficient $\alpha$ (which is expressed by an equation $I=KV^\alpha$, where V represents voltage, K a constant and I current) have been developed for eliminating the series gap. In an arrester utilizing a characteristic element made up of a stack of such metal oxide type disc shaped resistors, its characteristics should not vary appreciably because degradation thereof results in the increase in the normal leakage current and temperature rise causing thermal rupture.

For this reason, it is necessary to seasonally check the characteristics of the zinc oxide type resistor elements.

The characteristic check of an arrester is usually performed by a circuit shown in FIG. 1. As shown, an arrester constituted by a series gap G and a nonlinear resistor $R_1$ is grounded through a resistor $r_1$ and the voltage drop across the resistor $r_1$ is measured to check the variation in the characteristics of the nonlinear resistor $R_1$. As shown in an equivalent circuit shown in FIG. 2, in an arrester utilizing zinc oxide nonlinear resistors $R_2$, each nonlinear resistor $R_2$ of the characteristic element is shunted by an electrostatic capacitance $C_2$ so that the method of measuring the voltage drop across a resistor $r_2$ connected between the arrester and the ground is not effective.

Thus, the phase relationship among the impressed voltage e and the currents $i_{C2}$ and leakage current $i_{R2}$ which flow through the electrostatic capacitance $C_2$ and the nonlinear resistor $R_2$ respectively is shown in FIG. 3. The factor that produces Joule heat which accelerates degradation of the nonlinear resistor $R_2$ is attributable to the leakage current $i_{R2}$ flowing therethrough. However, as shown in FIG. 3 the capacitive leakage current $i_{C2}$ and the resistive leakage current $i_{R2}$ have a phase difference of 90° and their crest values have a relationship of $i_{C2}>i_{R2}$.

Accordingly, even when the leakage current of the arrester is detected by using resistor $r_2$ the resistive leakage current $i_{R2}$ which is essential to determine the degree of degradation of the arrester characteristics would be masked by the capacitive leakage current $i_{C2}$. Thus, it is difficult to measure the exact value of the resistive leakage current.

Various methods have been proposed to eliminate the capacitive leakage current $i_{C2}$. According to one method, a condenser is connected to the line terminal of the zinc oxide type arrester to pass current having the same phase as the capacitive leakage current $i_{C2}$ of the zinc oxide arrester. The phase of the leading current flowing through the condenser is shifted 180° by a phase shifter to match its phase with that of the capacitive leakage current $i_{C2}$. Then the two currents are added together after adjusting the crest value of the leading current to be equal to that of the capacitive leakage current $i_{C2}$. This method assures accurate measurement of the resistive leakage current $i_{R2}$.

This method, however, is not advantageous in that it is necessary to use an additional capacitor for the purpose of obtaining a waveform that cancels the charging current of the arrester, that the grounding connection must be interrupted temporarily, and that the measuring procedure is troublesome.

SUMMARY OF THE INVENTION

It is therefore an object of this invention to provide a simple apparatus for detecting degradation of the characteristics of an arrester utilizing metal oxide type nonlinear resistors under an operating state.

According to this invention, there is provided apparatus for detecting deterioration of characteristics of an arrester utilizing a characteristic element made up of metal oxide type nonlinear resistors, the apparatus comprising a linear resistor and a capacitor which are connected in parallel between the characteristic element and ground, the impedances of the linear resistor and the capacitor being predetermined such that the product of the resistance of the characteristic element and an electrostatic capacitance in parallel therewith will be equal to the product of the impedances when resistive leakage current through the characteristic element reaches a predetermined value, and means responsive to a voltage drop across the linear resistor to display degradation of the characteristic element.

BRIEF DESCRIPTION OF THE DRAWINGS

In the accompanying drawings:

FIG. 1 is a connection diagram showing a prior apparatus for detecting degradation of the characteristics of an arrester utilizing a characteristic element comprising a stack of metal oxide resistors;

FIG. 2 shows an equivalent circuit of the arrester shown in FIG. 1;

FIG. 3 shows waveforms of voltage and current flowing through the arrester shown in FIGS. 1 and 2;

DESCRIPTION OF THE PREFERRED EMBODIMENT

Figure 4:
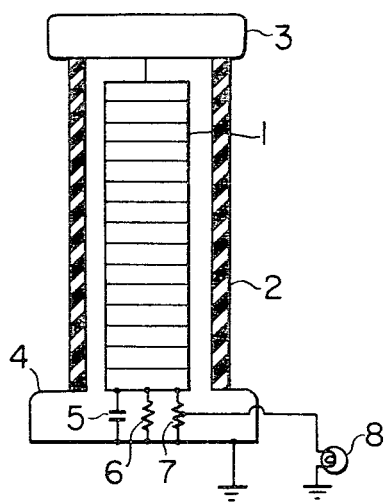
FIG. 4 is a schematic longitudinal sectional view of one embodiment of the present invention.

In a preferred embodiment of this invention shown in FIG. 4, a characteristic element 1 comprising a stack of metal oxide resistors is contained in an insulating tube 2 air tightly closed by a high voltage or line cap 3 and a grounded pedestal 4. The term metal or zinc oxide type nonlinear resistor used herein means a sintered nonlinear resistor containing 90 mole % of zinc oxide and 0.01–10 mole% of impurities selected from the group consisting of antimony oxide $Sb_2O_3$, manganese oxide $MnO_2$ and bismuth oxide $Bi_2O_3$ or a modified sintered nonlinear resistor containing 75–85 mole% of zinc oxide, 12–15 mole% of manganese oxide and the remainder of impurities such as antimony oxide or bismuth oxide. Further, instead of using a metal cap 3 and an insulating tube 2, an insulator cap through which a lead wire to the characteristic element 1 extends and a metal tube filled with such insulating gas as $SF_6$ can also be used. The characteristic element 1 is connected to the pedestal 4 via a capacitor 5, a zinc oxide resistor 6 and a linear resistor 7 which are connected in parallel. The linear resistor 7 is connected to the ground through a neon lamp 8 which is lighted by the voltage across the resistor 7.

Figure 5:
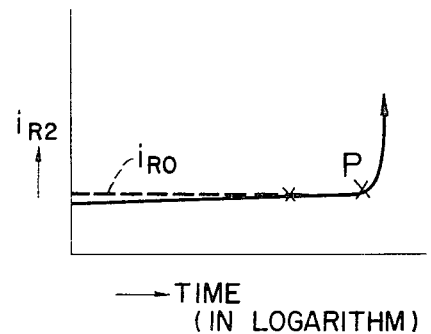
FIG. 5 is a graph showing the increasing characteristic of resistive leakage current.
Figure 6:
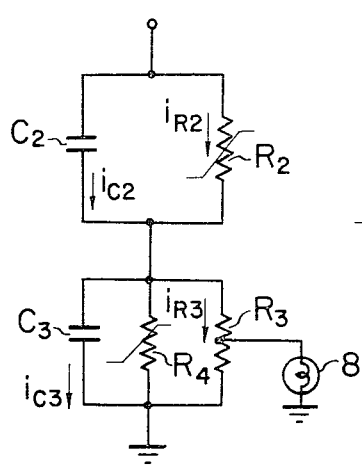
FIG. 6 shows an equivalent circuit of the embodiment shown in FIG. 4.

The resistive leakage current $i_{R2}$ increases as shown in FIG. 5, as the characteristics of the zinc oxide resistors degrade. For this reason, it is necessary to produce an alarm at a suitable time, for example 1 to 3 years before the leakage current reaches a value (shown by P in FIG. 5) at which run out or breakage of the arrester would occur. This current of the resistive leakage current is shown as $i_{R0}$. Like FIG. 2, the equivalent circuit of the embodiment shown in FIG. 4 is represented by FIG. 6 in which $C_3$ represents the combined electrostatic capacitances of capacitor 5 and the zinc oxide resistor 6, $R_4$ the resistance of the zinc oxide nonlinear resistor 6 and $R_3$ the resistance of the linear resistor 7.

The resistance values $R_2$ and $R_4$ of the nonlinear resistors 1 and 6 correspond to the resistance value when the current $i_{R2}$ flowing through the nonlinear resistor $R_2$ reaches the current value $i_{R0}$ shown in FIG. 5, and the values of the electrostatic capacitance $C_3$ and the linear resistor 7 are selected to satisfy the following relationship $$C_2 \times R_2 = C_3 \times R_3.$$

Figure 7:
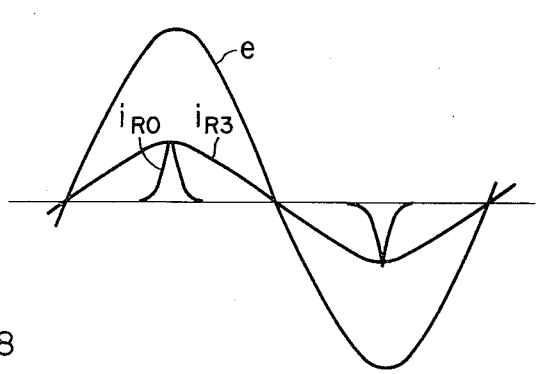
FIG. 7 shows waveforms of voltage applied to the arrester, leakage current flowing through the arrester and current flowing through a linear resistor.

The resistive leakage current $i_{R0}$ of the zinc oxide characteristic element 1, the current $i_{R3}$ flowing through the linear resistor 7 and the voltage e impressed upon the arrester are shown in FIG. 7.

Since $i_{R0}$ represents the leakage current of the nonlinear resistor whereas $i_{R3}$ the current flowing through the linear resistor it is impossible to satisfy the relationship described above under all instantaneous values of the impressed voltage. For this reason, it is impossible to make equal the current waveforms $i_{R0}$ and $i_{R3}$ but it is possible to make equal their crest values.

At this time, the neon lamp 8 is lighted by the voltage drop across the linear resistor 7. As can be noted from FIG. 6, the current $i_{R3}$ flowing through the linear resistor $R_3$ increases when the resistive leakage current $i_{R2}$ of the zinc oxide resistors exceeds $i_{R0}$. The neon lamp 8 is lighted always in a range expressed by a relation $i_{R2} \geq i_{R0}$ which is convenient for maintenance.

When the arrester operates under abnormal voltage such as surge voltage the nonlinear resistor 6 protects the capacitor 5 and the linear resister 7.

Although a neon lamp 8 has been shown, any other alarm device such as a buzzer can also be used for detecting deterioration of the arrester.

As above described, according to this invention it is possible to readily detect deterioration of the metal oxide type arrester by adding simple and inexpensive detecting device.

We claim:

1. Apparatus for detecting deterioration of characteristics of an arrester utilizing a characteristic element made of metal oxide type nonlinear resistor, said apparatus comprising a linear resistor and a capacitor which are connected in parallel between said characteristic element and ground, the impedances of said linear resistor and said capacitor being predetermined such that the product of the resistance of said characteristic element and an electrostatic capacitance in parallel therewith will be equal to the product of said impedances when resistive leakage current through said characteristic element reaches a predetermined value, and means responsive to a voltage drop across said linear resistor to display degradation of said characteristic element.

2. The apparatus according to claim 1 which further comprises a nonlinear resistor connected in parallel with said capacitor and said linear resistor.

3. The apparatus according to claim 2 wherein said nonlinear resistor comprises zinc oxide.

4. The apparatus according to claim 1 wherein said display means comprises a neon lamp.

* * * * *